United States Patent [19]

Ozawa et al.

[11] Patent Number: 4,658,212

[45] Date of Patent: Apr. 14, 1987

[54] CONNECTOR TERMINAL EXAMINATION DEVICE

[75] Inventors: Shinichi Ozawa; Masayuki Mizutani, both of Yokkaichi, Japan

[73] Assignee: Tokai Electric Wire Company Limited, Yokkaichi, Japan

[21] Appl. No.: 685,917

[22] Filed: Dec. 26, 1984

[30] Foreign Application Priority Data

Dec. 27, 1983 [JP] Japan ................. 58-250329

[51] Int. Cl.$^4$ .......... G01R 1/06; G01R 31/02
[52] U.S. Cl. ............... 324/158 F; 324/72.5; 324/158 P
[58] Field of Search ........... 324/158 P, 158 F, 72.5, 324/73 PC, 149; 339/108 TP, 75 M, 75 R

[56] References Cited

U.S. PATENT DOCUMENTS

| 1,610,563 | 12/1926 | McIlvane | 324/72.5 |
| 2,515,004 | 7/1950 | Haupt | 324/72.5 |
| 4,225,819 | 9/1980 | Grau et al. | 324/158 F |
| 4,232,262 | 11/1980 | Emo et al. | 324/158 F |

FOREIGN PATENT DOCUMENTS

| 0821676 | 11/1951 | Fed. Rep. of Germany | 324/72.5 |
| 1754669 | 10/1966 | Japan | 324/158 P |
| 53-18545 | 5/1978 | Japan . | |
| 55-8221 | 2/1980 | Japan . | |

OTHER PUBLICATIONS

"Multipoint Test Probe for Printed Cards", by Renz, IBM Tech. Disc. Bull., 7/74, vol. 17, #2, pp. 459–460.

Primary Examiner—Reinhard J. Eisenzopf
Assistant Examiner—W. Burns
Attorney, Agent, or Firm—Ernest A. Beutler

[57] ABSTRACT

A connector terminal examination device includes a frame, an examination head mounted on the frame for linear movement in one and the other directions, a connector holder mounted on the frame at one side of the examination head and adapted to receive a connector inserted from the upper side thereof, and an operator disposed on the frame at the opposite side of the examination head to the connector holder and adapted to drive the examination head towards and away from the connector holder. The examination head has a plurality of probes projected forwardly therefrom. Each of the probes has a front probe portion and a rear probe portion slidably received in a metallic tube and independently biased forwardly such that a predetermined gap is formed between the probe portions when they are in the freed condition. The rear probe portion is electrically insulated from the metallic tube. The front probe portion is adapted to be moved into the metallic tube so as to make electric contact with the rear probe portion when pressed by a corresponding terminal of the connector at the time of the examination.

7 Claims, 3 Drawing Figures

CONNECTOR TERMINAL EXAMINATION DEVICE

BACKGROUND OF THE INVENTION

The present invention relates to a connector terminal examination device for examining states of insertion of wire terminals in a connector to check for the positions and conductivity of the wire terminals.

Japanese Utility Model Publication Nos. 18545/1978 and 8221/1980 disclose connector terminal examination devices. Both of these known devices have a main body provided in the front side thereof with a connector fitting portion and a plurality of parallel examination pins projected from the main body towards the connector to be examined. The examination pins are urged towards the connector and are divided into two portions at their longitudinal mid portions. During the examination, when the portions of the pins remote from the main body are contacted and pushed by the terminals, these portions are moved backward into contact with the other portions of the pins to complete electric circuits, thus allowing the examination of the states of the connector terminals.

The examination device proposed in Publication No. 18545/1978, however, involves certain problems concerning the mounting of the connector on a jig, as well as easiness of the examination. On the other hand, the examination device disclosed in Publication No. 8821/1980, wherein the examination pins are directly received by the through holes formed in the main body of the device, suffers from a problem in that the end pins, i.e., the pin portions remote from the main body, which are forced to move reciprocatingly, friction on the wall of the through bores to produce fine ducts and powders of the plastic which is used as the material of the main body. In addition, the examination performance is often impaired due to conduction failure caused by the plastic powders coming between two portions of the pins.

SUMMARY OF THE INVENTION

Accordingly, an object of the invention is to provide a connector terminal examination device (referred to simply as "examination device", hereinunder) which permits a highly stable examination of the connector terminal, thereby overcoming the above-described problems of the prior art.

To this end, according to the invention, there is provided a connector terminal examination device comprising: a frame; an examination head mounted on the frame for linear movement in one and the other directions; a connector holder mounted on the frame at one side of the examination head and adapted to receive a connector inserted from the upper side thereof; and an operating means disposed on the frame at the opposite side of the examination head to the connector holder; wherein the examination head has a plurality of probes projected forwardly therefrom, each of the probes having a front probe portion and a rear probe portion slidably received in a metallic tube and independently biased forwardly such that a predetermined gap is formed between the probe portions when they are in the freed condition, the rear probe portion being electrically insulated from the metallic tube, the front probe portions being adapted to be moved into the metallic tube so as to make electric contact with the rear probe portion when pressed by a corresponding terminal of the connector at the time of the examination.

The above and other objects, features and advantages of the invention will become clear from the following description of the preferred embodiment when the same is read in conjunction with the accompanying drawings.

DESCRIPTION OF THE PREFERRED EMBODIMENT

Figure 1:
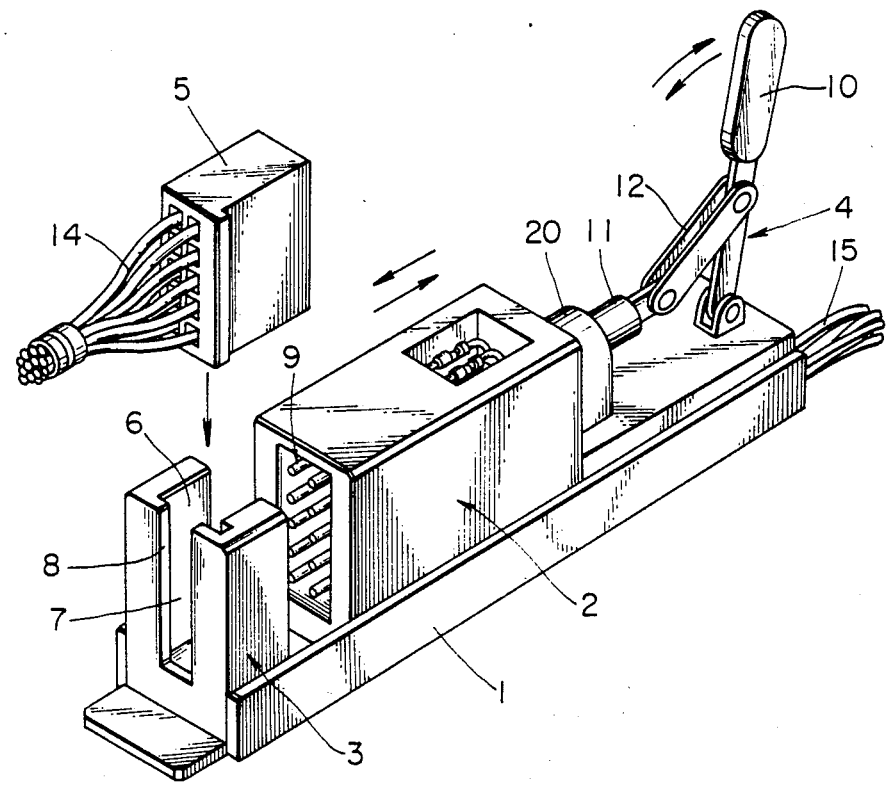
FIG. 1 is a perspective view of an embodiment of the invention.
Figure 2:
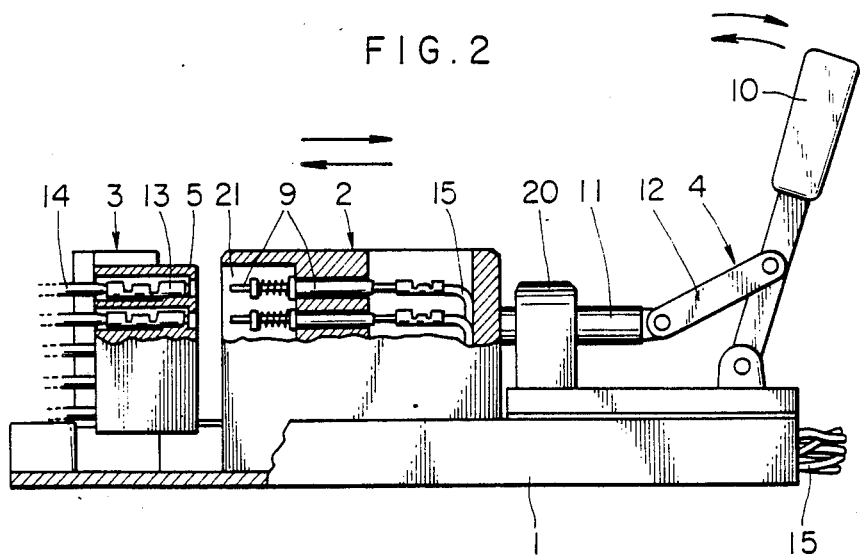
FIG. 2 is a front elevational view of the embodiment shown in FIG. 1.
Figure 3:
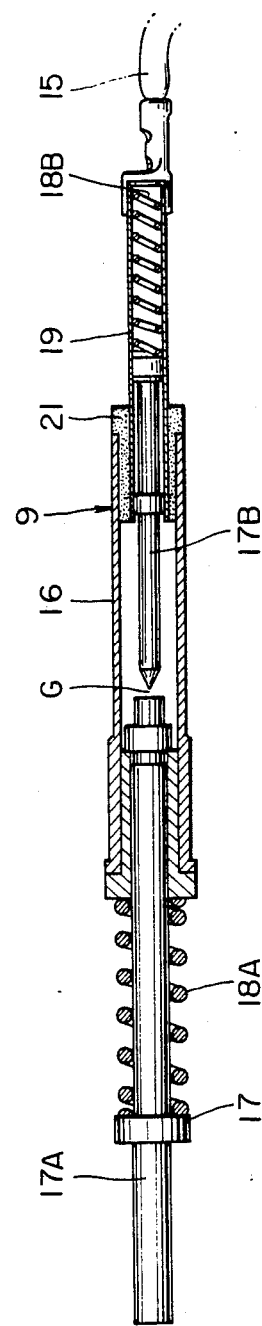
FIG. 3 is a front elevational view of a probe for use in an examination head of the embodiment shown in FIG. 1.

Referring to FIGS. 1 to 3, an embodiment of the terminal examination device of the invention includes a channel-shaped frame 1 having a substantially U-shaped cross-section, and an examination head 2 mounted on an intermediate portion of the frame 1. The examination head 2 has a plurality of examination probes 9 and is movable back and forth on the frame 1. A connector holder 3 is fixed to the front end portion of the frame 1 so as to oppose the examination head 2. The holder 3 has a connector mounting portion which is opened upwardly such as to surround the connector 5 mounted therein. The wires 14 of the connector 5 are inserted into opening 7 formed in a holder plate 8. In this state, the connector 5 is held with its rear peripheral edge 5' held in contact with the holder plate 8 so as not to be withdrawn rearwardly. An operation lever 10 is provided on the frame 1 at the rear side of the examination head 1. The operation lever 10 is connected, through a link 12 secured to the point of action thereof, to an operation shaft 11 provided at the rear end of the examination head 2. The operation lever 10, link 12 and the operation shaft 11 in combination constitute an operation means 4. The arrangement is such that a forward inclination and backward retraction to upright position of the operation lever applies amplified pressing and tensing forces to the examination head 2, so that the examination head moved forwardly and rearwardly along the frame 1. In the drawings, a reference numeral 20 denotes a guide for the operation shaft 11.

More specifically, the examination head 2 is provided at its front portion with a recess 21 which partially receives the head of the connector 5. Through holes are formed to extend from the bottom of the recess rearwardly of the examination head 2. The examination probes 9 are inserted into these through holes with their heads projected into the recess 21. It will be seen that the positions and number of the examination probes 9 correspond to those of the terminals 13 in the connector 5 to be examined.

As will be seen from FIG. 3, the examination probe 9 is constituted by a front probe portion 17A and a rear probe portion 17B which are slidably received by a metallic tube 16. The front probe portion 17A and the rear probe portion 17B are biased forwardly independently of each other. In the freed state of these probe portions 17A and 17B, a small gap is formed between the rear end of the front probe portion 17A and the front end of the rear probe portion 17B. Namely, in the freed state, the front half part of the front probe portion 17A projects from the metallic tube 16 and is biased forwardly by a coiled spring 18A which acts between a step 17' formed on an intermediate portion of the front half part and the metallic tube 16. In the illustrated freed state, the front probe portion 17A rests at the lower dead point. On the other hand, the rear probe portion 17B has front half part received in the metallic tube 16, while the rear end of the same is received in a metallic sheath 19 together with a coiled spring 18B acting on the rear end thereof. The sheath 19 is connected at its front portion to the metallic tube 16 through the medium of the insulating member 21. The rear probe portion 17B is biased forwardly by the coiled spring 18B which is received in the sheath 19. In the freed state, the rear probe portion 17B rests at the illustrated lower dead point such that a gap G is formed between itself and the front probe portion 17A. When the front probe portion 17A is moved into the metallic tube 16 by an external force, the front probe portion 17A is made to contact with the rear probe portion 17B to establish an electric conduction therebetween.

In the use of the terminal examination device, the connector 5 to be examined is inserted into the connector holder 3 from the upper side as shown in FIG. 2. Thereafter, the operation lever 10 is inclined forwardly so that an amplified force is applied to the examination head 2 to urge the same forwardly. Consequently, the front edge of the connector 5 comes to be received in the recess 21 in the front end portion of the examination head 2. When the terminals 13 are mounted correctly in the connector 5, the front probe portions 17A interfere with the terminals 13 so as to be moved into the metallic tube 16 overcoming the force of the coiled spring 18A, and is made to contact with the rear probe portions 17B. By connecting the wires 14 of the terminals 13 to the wires 15 connected to respective sheathes 19 accomodating the rear probe portions 17B, closed circuits including the terminals 13 are completed so that the conductivity, i.e., the states of mounting of the terminals 13, can be confirmed. Namely, any terminal mounted in a wrong manner does not press the front probe portion 17A so that the circuit remains opened thus indicating the wrong mounting of terminal.

As has been described, the terminal examination device of the invention incorporates a hermetic examination probe having a metallic tube which receives the rear half part of the front probe portion 17A and the front half part of the rear probe portion 17B. Since the sliding of the front and rear probe portions 17A and 17B take place in the form of metal-to-metal contact state, the wear of the sliding parts inevitable in the conventional device is avoided. Consequently, the invasion of foreign matters and attaching of plastic powder and dust to the contact surfaces of probe portions are eliminated to stabilize the operation of the examination device.

In the terminal examination device of the invention, amplified pressing and pulling forces are applied by the forward inclination and backward retraction to the upright position of the operation lever provided at the rear side of the examination head, while the connector to be examined can be put into the examination position simply by being inserted into the connector holder from the upper side. The terminal examination device of the invention, therefore, can be operated easily such that, while the connector is put into and out of the examination position by one of the operator's hand, the operation lever is handled by the other hand.

Furthermore, since an amplified force is available for driving the examination head back and forth, the examination is conducted easily. Moreover, the probe assembly constructed as a unit can be handled easily for mounting and demounting on the examination head, which in turn facilitates the protective maintenance considerably.

Thus, the terminal examination device of the invention offers advantages such as an enhanced stability and reliability of the examination and improvement in the easiness of the examination.

Although the invention has been described through specific terms, it is to be noted here that the described embodiment is only illustrative and various changes and modifications may be imparted thereto without departing from the scope of the invention which is limited solely by the appended claim.

What is claimed is:

1. A connector terminal examination device comprising:
   a frame;
   an examination head mounted on said frame;
   a connector holder mounted on said frame at one side of said examination head and adapted to receive and hold a connector inserted from an upper side thereof; and
   one of said examination head and said connector holder being supported for reciprocation relative to said frame for relative movement of said examination head and said connector holder toward and away from each other;
   an operating means disposed on said frame and adapted to drive said one of said examination head and said connector holder towards and away from the other;
   wherein said examination head comprises a metallic tube, a probe extending forwardly from said metallic tube, said probe having a front probe portion that extends forwardly from said tube for entry into said connector and a rear probe portion slidably received in said metallic tube and means for independently biasing each of said probe portions toward said connector holder, stop means for establishing a predetermined gap between said probe portions when they are in a freed condition, at least one of said probe portions being electrically insulated from said metallic tube, said front probe portion being adapted to be moved into said metallic tube so as to make electric contact with said rear probe portion when pressed by a corresponding terminal of said connector at a time of examination.

2. A connector examination device according to claim 1, wherein said operating means includes an operation lever which is adapted to drive said examination head through a link.

3. A connector examination device according to claim 1 wherein the connector holder is fixed relative to the frame and the examination head is supported for reciprocation relative to the frame, the operating means being operatively connected to the examination head for effecting its reciprocation.

4. A connector examination device according to claim 2 wherein said operating means includes an operation lever which is adapted to drive said examination head through a link.

5. A connector examination device according to claim 1 wherein the connector holder comprises a body having an open rear end adapted to pass wires extending from the connector being examined and an adjacent rear face adapted to engage and support the connector against movement relative to the connector holder.

6. A connector examination device according to claim 1 wherein the front probe portion is slidably supported within a forward end of the metallic tube by an insulating bushing, coil compression spring means acting between said front probe portion and said insulating bushing for urging said front probe portion outwardly relative to said metallic tube, said rear probe portion being supported within a tubular member affixed relative to the metallic tube by a second insulating bushing, and coil compression spring means received within said tube and urging said rear probe portion in a forward direction toward said front probe portion.

7. A connector examination device according to claim 6 wherein there are a plurality of probes mounted in the examination head in the manner described.

* * * * *